United States Patent
Jung et al.

(10) Patent No.: US 10,446,771 B2
(45) Date of Patent: Oct. 15, 2019

(54) RADIATION DETECTOR

(71) Applicant: Kabushiki Kaisha Toshiba, Minato-ku (JP)

(72) Inventors: Hyangmi Jung, Yokohama (JP); Yuko Nomura, Kawasaki (JP); Satomi Taguchi, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/911,346

(22) Filed: Mar. 5, 2018

(65) Prior Publication Data
US 2019/0148659 A1 May 16, 2019

(30) Foreign Application Priority Data
Nov. 13, 2017 (JP) ................................ 2017-218400

(51) Int. Cl.
*H01L 31/18* (2006.01)
*H01L 51/42* (2006.01)
(Continued)

(52) U.S. Cl.
CPC ...... *H01L 51/4253* (2013.01); *H01L 51/0047* (2013.01); *H01L 51/0077* (2013.01); *B82Y 15/00* (2013.01)

(58) Field of Classification Search
CPC .......... H01L 2251/308; H01L 51/0043; H01L 51/4253; H01L 27/308
See application file for complete search history.

(56) References Cited

U.S. PATENT DOCUMENTS

2010/0137518 A1* 6/2010 Yang .................... C08F 293/005
525/186
2013/0276886 A1* 10/2013 Worfolk .............. H01L 51/0043
136/263
(Continued)

FOREIGN PATENT DOCUMENTS

JP 2014-81363 5/2014
JP 2015-92546 5/2015
(Continued)

OTHER PUBLICATIONS

Karagiannidis et al., Thermal annealing effect on the nanomechanical properties and structure of P3HT: PCBM thin films, Thin Solid Films 519 (2011) 4105-4109.*
(Continued)

*Primary Examiner* — Jaehwan Oh
(74) *Attorney, Agent, or Firm* — Oblon, McClelland, Maier & Neustadt, L.L.P.

(57) ABSTRACT

According to one embodiment, a radiation detector includes first, and second conductive layers, and an organic layer. The organic layer is provided between the first and second conductive layers. A first thickness of the organic layer along a first direction from the second conductive layer toward the first conductive layer is 1 μm or more. The organic layer includes a first compound of a first conductivity type, and a second compound of a second conductivity type. A first value of $(0.9 \cdot \lambda)/(w1 \cdot \cos \theta 1)$ for a first peak of X-ray analysis of the organic layer is not less than 13 nm and not more than 19 nm. The first value is obtained from a first Bragg angle $\theta 1$ (radians), a first full width at half maximum $w1$ (radians) of the $2\theta 1$ peak, and an X-ray wavelength $\lambda$ (nm). The $2\theta 1$ is not less than 0.0750 radians and not more than 0.1100 radians.

12 Claims, 6 Drawing Sheets

(51) Int. Cl.
*H01L 51/00* (2006.01)
*B82Y 15/00* (2011.01)

(56) References Cited

U.S. PATENT DOCUMENTS

| | | | |
|---|---|---|---|
| 2014/0166987 A1* | 6/2014 | Tovar | H01L 51/0071 |
| | | | 257/40 |
| 2014/0191218 A1* | 7/2014 | Katz | H01L 51/4273 |
| | | | 257/40 |
| 2016/0285022 A1* | 9/2016 | Gotanda | H01L 51/0012 |
| 2018/0143329 A1 | 5/2018 | Takasu et al. | |
| 2018/0198005 A1* | 7/2018 | Siegmund | H01L 51/447 |

FOREIGN PATENT DOCUMENTS

| | | |
|---|---|---|
| JP | 2018-85387 A | 5/2018 |
| WO | WO 2014/050862 A1 | 4/2014 |

OTHER PUBLICATIONS

Uladzimir Zhokhavets et al. "Relation between absorption and crystallinity of poly(3hexylthiophene)/fullerene films for plastic solar," Chemical Physics Letters, 418, 2006, pp. 4.

Wanli Ma et al. "Thermally Stable, Efficient Polymer Solar Cells with Nanoscale Control of the Interpenetrating Network Morphology", Advanced Functional Materials, 2005, pp. 6.

Akarin Intaniwet et al. "Achieving a Stable Time Response in Polymeric 3 Radiation Sensors Under Charge Injection by X-rays", American Chemical Society, Applied Materials & Interfaces, vol. 2, No. 6, 2010, pp. 8.

\* cited by examiner

RADIATION DETECTOR

CROSS-REFERENCE TO RELATED APPLICATIONS

This application is based upon and claims the benefit of priority from Japanese Patent Application No. 2017-218400, filed on Nov. 13, 2017; the entire contents of which are incorporated herein by reference.

FIELD

Embodiments described herein relate generally to a radiation detector.

BACKGROUND

It is desirable to increase the sensitivity of a radiation detector.

DETAILED DESCRIPTION

Figure 1:
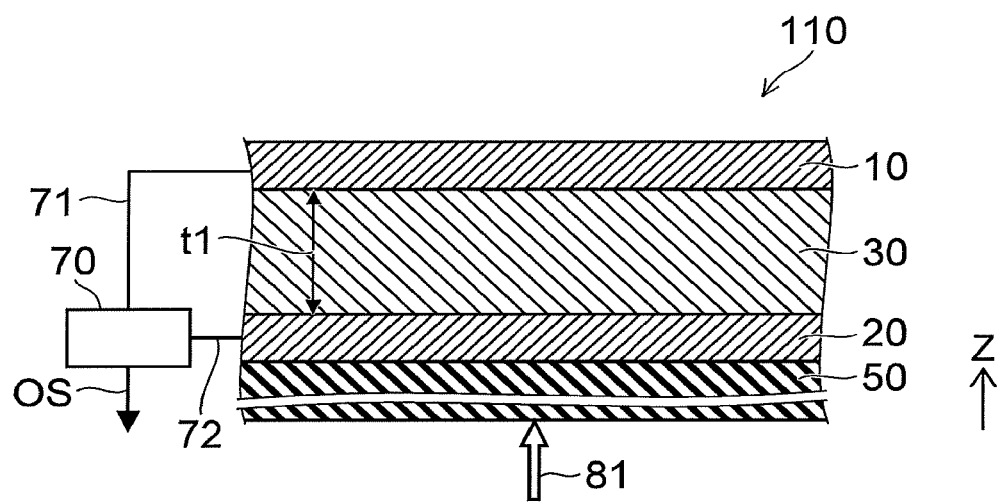
FIG. 1 is a schematic cross-sectional view illustrating a radiation detector according to a first embodiment.

According to one embodiment, a radiation detector includes a first conductive layer, a second conductive layer, and an organic layer. The organic layer is provided between the first conductive layer and the second conductive layer. A first thickness of the organic layer along a first direction from the second conductive layer toward the first conductive layer is 1 μm or more. The organic layer includes a first compound of a first conductivity type, and a second compound of a second conductivity type. A first value of $(0.9 \cdot \lambda)/(w1 \cdot \cos \theta1)$ for a first peak of X-ray analysis of the organic layer is not less than 13 nm and not more than 19 nm. The first value is obtained from a first Bragg angle θ1 (radians), a first full width at half maximum w1 (radians) of the 2θ1 peak, and an X-ray wavelength λ (nm). The 2θ1 is not less than 0.0750 radians and not more than 0.1100 radians.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a radiation detector according to a first embodiment.

As shown in FIG. 1, the radiation detector 110 according to the first embodiment includes a first conductive layer 10, a second conductive layer 20, and an organic layer 30. The organic layer 30 is provided between the first conductive layer 10 and the second conductive layer 20.

A substrate 50 is further provided in the example. The second conductive layer 20 is provided between the substrate 50 and the first conductive layer 10.

The direction from the second conductive layer 20 toward the first conductive layer 10 is taken as a first direction (a Z-axis direction). The thickness (a first thickness t1) of the organic layer 30 along the first direction is 1 μm or more.

For example, radiation 81 is incident on the radiation detector 110. In the example, the radiation 81 is incident on the organic layer 30 via the substrate 50 and the second conductive layer 20. The radiation 81 is, for example, β-rays. Excitons are generated in the organic layer 30 by the incidence of the radiation 81. Thereby, movable charges (electrons and holes) are generated. These charges can be extracted by applying a voltage (or an electric field) between the first conductive layer 10 and the second conductive layer 20. For example, a current that corresponds to the intensity of the incident radiation 81 is obtained. The radiation 81 can be detected by detecting the amount of the charge (e.g., the magnitude of the current).

A detection circuit 70, a first interconnect 71, and a second interconnect 72 are provided in the example. One end of the first interconnect 71 is electrically connected to the first conductive layer 10. Another end of the first interconnect 71 is electrically connected to the detection circuit 70. One end of the second interconnect 72 is electrically connected to the second conductive layer 20. Another end of the second interconnect 72 is electrically connected to the detection circuit 70. An output signal OS that corresponds to the intensity of the radiation 81 is obtained from the detection circuit 70.

The radiation detector 110 may include the first interconnect 71 and the second interconnect 72. The radiation detector 110 may further include the detection circuit 70.

Figure 2:
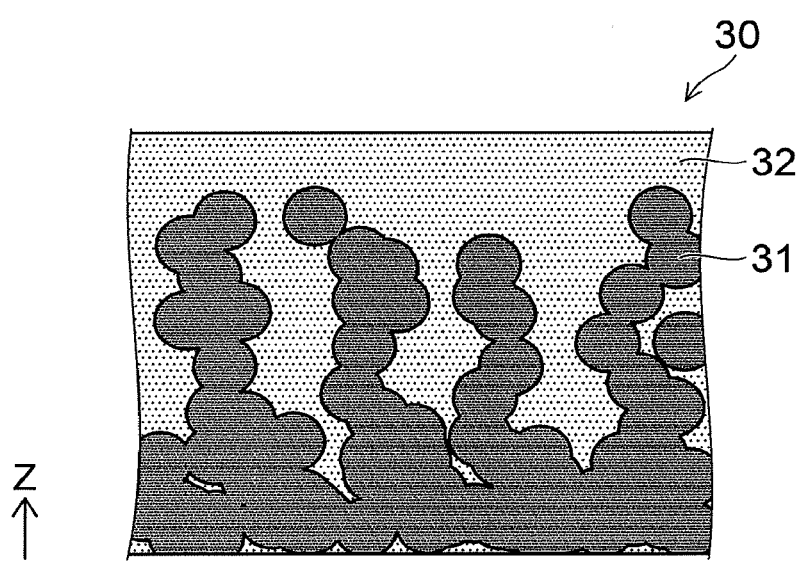
FIG. 2 is a schematic cross-sectional view illustrating a portion of the radiation detector according to the first embodiment.

FIG. 2 is a schematic cross-sectional view illustrating a portion of the radiation detector according to the first embodiment.

Figure 3A:
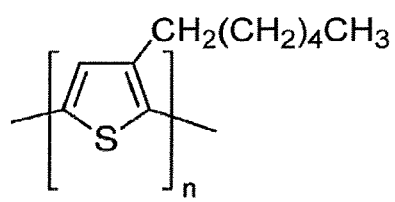
FIG. 3A and FIG. 3B are schematic views illustrating materials used in the radiation detector according to the first embodiment.
Figure 3B:
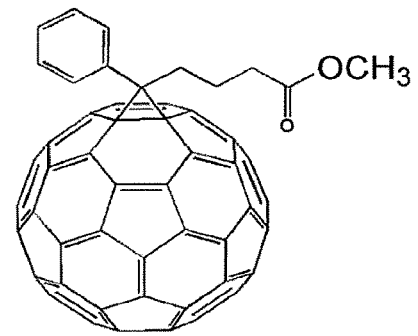

FIG. 3A and FIG. 3B are schematic views illustrating materials used in the radiation detector according to the first embodiment.

FIG. 2 schematically shows the organic layer 30. The organic layer 30 includes a first compound 31 and a second compound 32. The first compound 31 is of a first conductivity type (e.g., a p-type). The second compound 32 is of a second conductivity type (e.g., an n-type).

The first compound 31 includes, for example, polythiophene, a derivative of polythiophene, etc. The first compound 31 includes, for example, poly(3-hexylthiophene) (P3HT (referring to FIG. 3A)). Examples of the first compound 31 are described below.

The second compound 32 includes, for example, fullerene or a fullerene derivative. The second compound 32 includes, for example, [6,6]-phenyl-$C_{61}$-butyric acid methyl ester (60PCBM (referring to FIG. 3B)). Examples of the second compound 32 are described below.

A region (a first conductivity-type region) that includes the first compound 31 and a region (a second conductivity-type region) that includes the second compound 32 are mixed in the organic layer 30. For example, the organic layer 30 has, for example, a bulk heterojunction structure. The organic layer 30 is, for example, an organic semiconductor layer.

As described above, the first thickness t1 of the organic layer 30 is 1 µm or more. Because the first thickness t1 is 1 µm or more, a high trap efficiency of the radiation 81 (e.g., β-rays) is obtained. The radiation 81 (e.g., β-rays) is effectively converted into charge in the organic layer 30. Thereby, high sensitivity is obtained. In the case where the first thickness t1 is excessively thin, for example, the trap efficiency of the β-rays decreases. The radiation 81 may include α-rays.

It is favorable for the first thickness t1 to be 2000 µm or less. In the case where the first thickness t1 is excessively thick, for example, the sensitivity to γ-rays becomes high. The detection of the β-rays substantially decreases due to the high sensitivity to γ-rays.

In the embodiment, it is more favorable for the first thickness t1 to be, for example, not less than 10 µm and not more than 1000 µm. A higher sensitivity of the detection of the β-rays is obtained.

As a first reference example, 60PCBM and P3HT may be used as the photoelectric conversion layer of a solar cell, etc. In such a photoelectric conversion layer, the thickness of the photoelectric conversion layer is, for example, 500 nm or less. Because the thickness of the photoelectric conversion layer is 500 nm or less, light in the entire wavelength range of sunlight is absorbed. However, in the case where the photoelectric conversion layer is thicker than 500 nm, for example, the transport distance of the charge increases; the loss due to deactivation increases; and the photoelectric conversion efficiency decreases. Further, the internal resistance is high; and the photoelectric conversion efficiency therefore decreases. Therefore, the thickness of the photoelectric conversion layer of the solar cell or the like is set to 500 nm or less.

Conversely, in the embodiment, the charge is generated in the organic layer 30 by the incidence of the radiation 81. For example, the direct conversion from the radiation 81 to the charge is performed. The transmissivity of the radiation 81 is higher than the transmissivity of light. Therefore, in the case where the radiation 81 is directly converted by the organic layer 30, the first thickness t1 of the organic layer 30 is set to be 1 µm or more and is extremely thick. Thereby, a high trap efficiency of the radiation 81 is obtained.

There is a radiation detector of a second reference example that uses a scintillator. In such a case, the light that is generated by the radiation 81 incident on the scintillator is incident on a photoelectric conversion layer. For example, indirect conversion is performed. The thickness of the photoelectric conversion layer in the second reference example is 500 nm or less. In the second reference example, the two conversions of the conversion from the radiation to the light and the conversion from the light to the charge are performed. Because the two conversions are performed, it is difficult to obtain a high conversion efficiency in the second reference example.

Conversely, in the embodiment, the first thickness t1 of the organic layer 30 is set to be 1 µm or more. Thereby, highly efficient direct conversion is obtained. For example, high sensitivity is obtained.

It was found that in the case where such a thick organic layer 30 is used, a unique phenomenon occurs in the compounds included in the organic layer 30. Experimental results relating to this phenomenon will now be described.

In a first experiment, a glass substrate is used as the substrate 50. The second conductive layer 20 is provided on the substrate 50. The second conductive layer 20 is ITO (having a thickness of 50 nm). An organic film is formed on the second conductive layer 20. The organic film is formed by coating a solution. The solution includes P3HT, 60PCBM, and a solvent. The weight ratio of P3HT and 60PCBM is 1:1. The solvent is chlorobenzene. The total concentration of P3HT and 60PCBM in the solution is 4 wt %.

The solution recited above is drop-cast on the second conductive layer 20 recited above. Subsequently, drying is performed by leaving idle for about 10 hours at about 25° C. At least a portion of the solvent is removed. The thickness of the organic layer 30 is about 25 µm.

Subsequently, heat treatment (e.g., annealing) is performed at various temperatures. The time of the heat treatment is 10 minutes. After the heat treatment, X-ray analysis (XRD (X-ray diffraction)) analysis of the organic layer 30 is performed.

Figure 4:
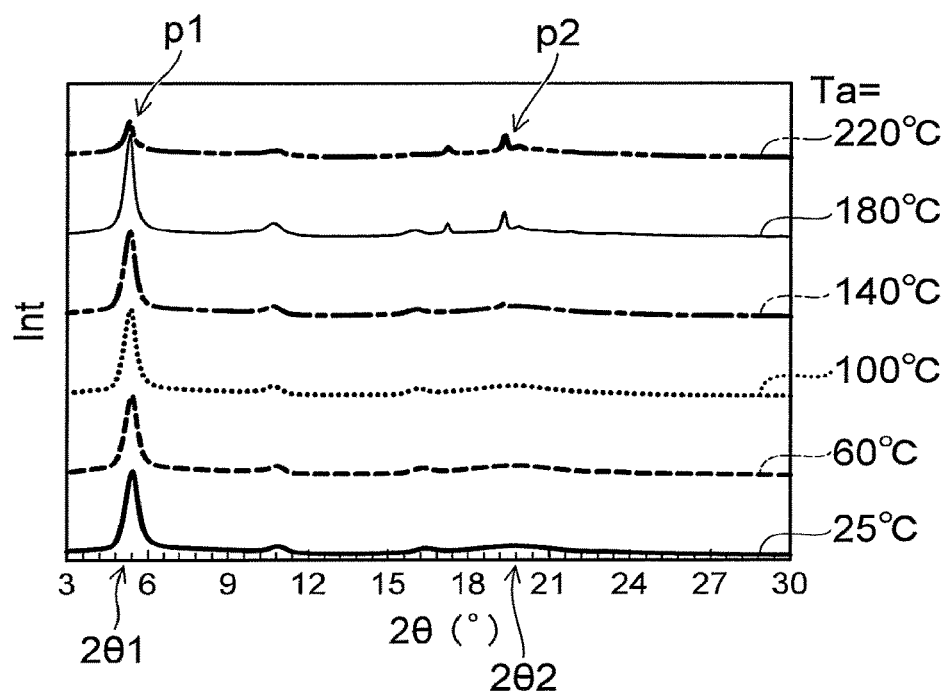
FIG. 4 is a graph illustrating characteristics of the organic layer included in the radiation detector.

FIG. 4 is a graph illustrating characteristics of the organic layer included in the radiation detector.

FIG. 4 illustrates the results of XRD analysis of samples of the first experiment. The horizontal axis of FIG. 4 is the angle 2θ (°) of the XRD analysis. The angle 2θ is 2 times the Bragg angle θ. The vertical axis is an intensity Int (arbitrary units) obtained in the XRD analysis. The results relating to samples having six mutually-different types of temperatures Ta of the heat treatment are shown in FIG. 4. The temperature Ta of the heat treatment is 25° C. to 220° C. for the samples. Heat treatment is not performed for the sample having the temperature Ta of 25° C.

In FIG. 4, a peak (a first peak p1) is observed at the position where the angle 2θ is about 5.3°. The first peak p1 corresponds to the (100) plane of P3HT. It is considered that the first peak p1 corresponds to the order between the main chains of the polymer of P3HT. On the other hand, a peak (a second peak p2) is observed at the position where the angle 2θ is about 19.3° when the temperature Ta of the heat treatment is 140° C. or more. It is considered that the second peak p2 corresponds to 60PCBM (the (311) plane of 60PCBM).

The wavelength of the X-rays used in the XRD analysis is taken as the X-ray wavelength λ (nm). The Bragg angle θ (radians) and the full width at half maximum w (radians) of the peak of the angle 2θ are obtained from the profile of the XRD analysis. A value d is obtained from the formula $d=(0.9 \cdot \lambda)/(w \cdot \cos \theta)$. The formula corresponds to the Scherrer equation. The value d corresponds to the average size of the region that is the object of the XRD analysis. For example, the value d corresponds to the size of a region that can be considered to be a crystal.

The first peak p1 of the first experiment will now be focused upon. At the first peak p1, an angle 2θ1 is about 5.3 degrees. Considering the error, the angle 2θ1 at the first peak p1 may be taken to be not less than 4.3 degrees and not more than 6.3 degrees. The angle 2θ1 is not less than 0.0750 radians and not more than 0.1100 radians. A first Bragg angle θ1 (radians) and the first full width at half maximum w1 (radians) of the angle 2θ1 peak (the first peak p1) are obtained from such a first peak p1. A first value d1 is obtained from the formula $d1=(0.9 \cdot \lambda)/(w1 \cdot \cos \theta1)$ based on these values.

On the other hand, the second peak p2 will now be focused upon. At the second peak p2, an angle 2θ2 is about 19.3 degrees. Considering the error, the angle 2θ2 at the second peak p2 may be taken to be not less than 18.3 degrees and not more than 20.3 degrees. The angle 2θ2 is not less than 0.3194 radians and not more than 0.3543 radians. A second Bragg angle θ2 (radians) and a second full width at half maximum w2 (radians) of the angle 2θ2 peak (the second peak p2) are obtained from such a second peak p2. A second value d2 is obtained from the formula $d2=(0.9 \cdot \lambda)/(w2 \cdot \cos \theta2)$ based on these values.

The measured values of the first value d1 and the second value d2 will now be described.

Figure 5:
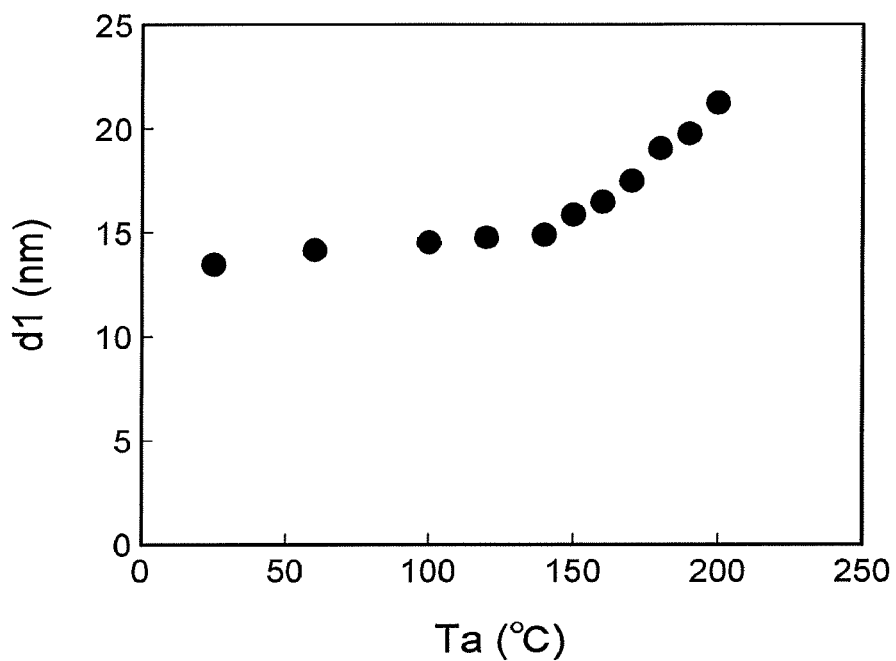
FIG. 5 is a graph illustrating characteristics of the organic layer included in the radiation detector.
Figure 6:
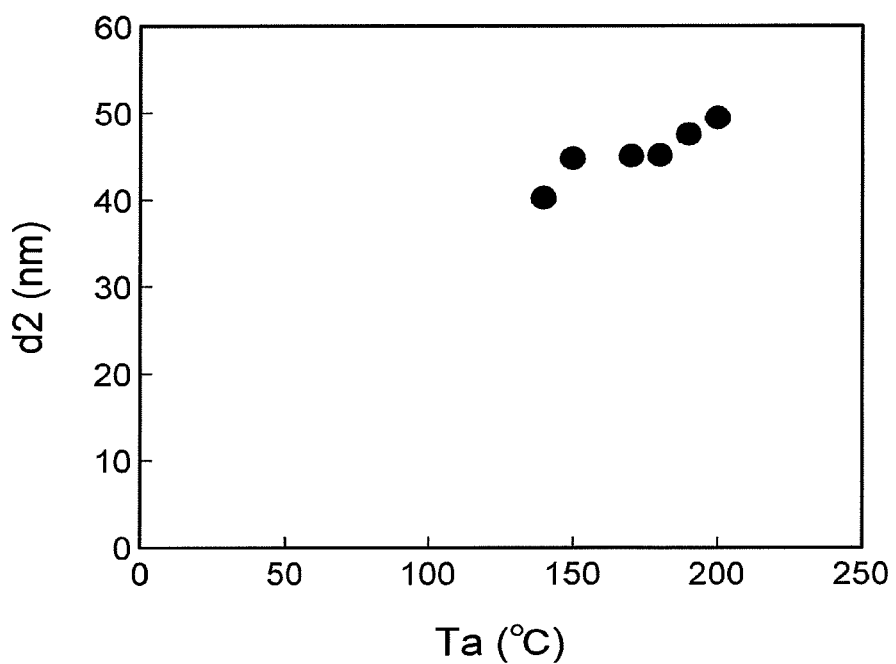
FIG. 6 is a graph illustrating characteristics of the organic layer included in the radiation detector.

FIG. 5 and FIG. 6 are graphs illustrating characteristics of the organic layer included in the radiation detector.

In FIG. 5 and FIG. 6, the horizontal axis is the temperature Ta (° C.) of the heat treatment. The vertical axis of FIG. 5 is the first value d1 (nm). The vertical axis of FIG. 6 is the second value d2 (nm).

As shown in FIG. 5, the first value d1 has a trend of increasing as the temperature Ta of the heat treatment increases. The change rate of the first value d1 to the temperature Ta is relatively low when the temperature Ta is 140° C. or less. The first value d1 increases abruptly when the temperature Ta increases from 140° C. to 200° C.

As shown in FIG. 5, the first value d1 is not less than about 13 nm for any temperature Ta. The first value d1 is about 13 nm even for the sample having the temperature Ta of 25° C. (the sample for which the heat treatment is not performed).

The first value d1 is as follows for the samples of the first experiment.

The first value d1 is calculated to be 13.5 nm when the temperature Ta is 25° C.

The first value d1 is calculated to be 14.1 nm when the temperature Ta is 60° C.

The first value d1 is calculated to be 14.5 nm when the temperature Ta is 100° C.

The first value d1 is calculated to be 14.7 nm when the temperature Ta is 120° C.

The first value d1 is calculated to be 14.9 nm when the temperature Ta is 140° C.

The first value d1 is calculated to be 15.9 nm when the temperature Ta is 150° C.

The first value d1 is calculated to be 16.5 nm when the temperature Ta is 160° C.

The first value d1 is calculated to be 17.5 nm when the temperature Ta is 170° C.

The first value d1 is calculated to be 19.0 nm when the temperature Ta is 180° C.

The first value d1 is calculated to be 19.7 nm when the temperature Ta is 190° C.

The first value d1 is calculated to be 21.2 nm when the temperature Ta is 200° C.

On the other hand, a reference example is known in which the thickness of the organic layer 30 is 300 nm or less (e.g., 100 nm or less). In the reference example, the value that corresponds to the first value d1 (the crystal size of P3HT) is 12.2 nm or less.

Conversely, for the samples of the first experiment, the first value d1 is not less than about 13 nm and is clearly large. For the samples of the first experiment, the first thickness t1 is about 25 μm; and it is considered that the thickness difference affects the difference of the first values d1.

For example, it is considered that the first compound 31 moves easily inside the film in the case where the first thickness t1 is thick (e.g., 1 μm or more). It is considered that the molecular chains included in the first compound 31 become ordered easily in the case where the first thickness t1 is thick. It is considered that the configuration in which the first value d1 is 13 nm or more is a specially-obtained configuration in which the first thickness t1 of the organic layer 30 is 1 μm or more.

In the samples of the first experiment, the first value d1 increases as the temperature Ta of the heat treatment increases. It is considered that this is because the molecular chains included in the first compound 31 move easily in the heat treatment when the temperature Ta is high. It is considered that, for example, the orderliness (the crystallinity) becomes high when the temperature Ta becomes high.

As shown in FIG. 6, the second value d2 has a trend of increasing as the temperature Ta of the heat treatment increases for the second peak p2. The second value d2 is not obtained when the temperature Ta is 100° C. or less because the second peak p2 does not occur.

The second value d2 is as follows for the samples of the first experiment.

The second value d2 is calculated to be 40.2 nm when the temperature Ta is 140° C.

The second value d2 is calculated to be 44.8 nm when the temperature Ta is 150° C.

The second value d2 is calculated to be 45.0 nm when the temperature Ta is 170° C.

The second value d2 is calculated to be 45.1 nm when the temperature Ta is 180° C.

The second value d2 is calculated to be 47.5 nm when the temperature Ta is 190° C.

The second value d2 is calculated to be 49.4 nm when the temperature Ta is 200° C.

A second experiment relating to the conversion efficiency will now be described. Due to the irradiation of the radiation 81 in the radiation detector 110, a charge is generated in the organic layer 30; and a current flows. The current that is obtained when the radiation 81 is irradiated on the organic layer 30 is large when the current obtained when light is irradiated on the organic layer 30 is large. Accordingly, in the second experiment, the magnitude of the current obtained by irradiating light on the organic layer 30 is evaluated; and the external quantum efficiency that relates to the light is evaluated. The conversion efficiency when the radiation 81 is irradiated on the organic layer 30 is high when the external quantum efficiency relating to the light is high.

In the second experiment, the second conductive layer 20 (ITO) is provided on the substrate 50 (the glass substrate). A solution that is used to form a hole transport layer is coated by spin coating on the second conductive layer 20. The hole transport layer is obtained by performing heat treatment for 20 minutes at 230° C. in air. A solution similar to that of the first experiment (a solution including P3HT, 60PCBM, and chlorobenzene) is coated onto the hole transport layer. The organic layer 30 is obtained by drying by leaving idle for about 10 hours at about 25° C. The thickness of the organic layer 30 is about 25 μm. An Al film that is used to form the first conductive layer 10 is formed by vapor deposition on the organic layer 30. Subsequently, heat treatment is performed at various temperatures Ta. The time of the heat treatment is 10 minutes. Thus, the samples are obtained. For these samples, the external quantum efficiency is measured when irradiating light from the substrate 50 side. The wavelength of the light is 770 nm. The bias voltage in the measurement is −100 V.

Figure 7:
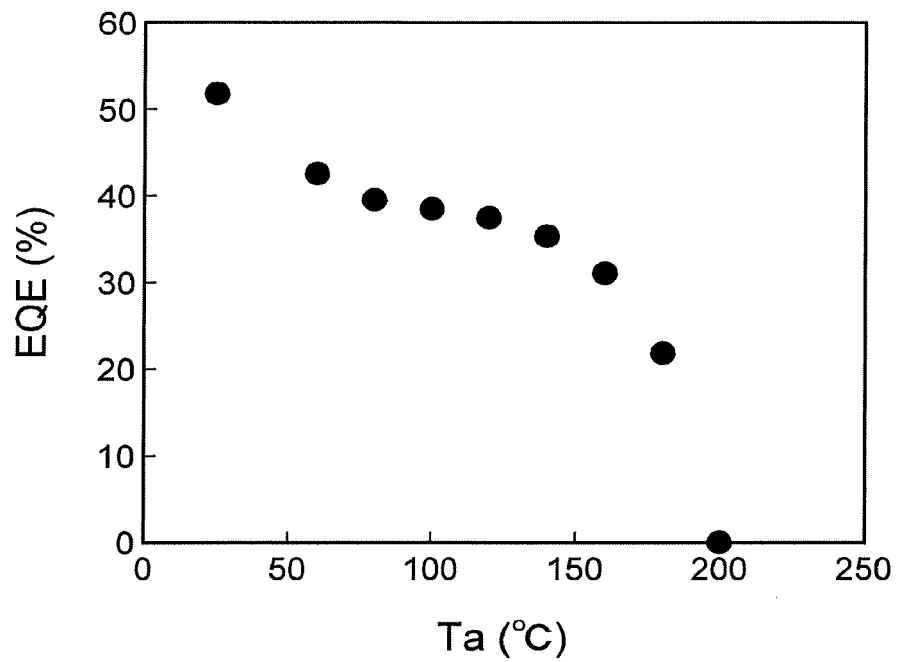
FIG. 7 is a graph illustrating characteristics of the samples of the radiation detector.

FIG. 7 is a graph illustrating characteristics of the samples of the radiation detector.

In FIG. 7, the horizontal axis is the temperature Ta (° C.) of the heat treatment. The vertical axis is an external quantum efficiency EQE (%).

As shown in FIG. 7, the external quantum efficiency EQE decreases as the temperature Ta of the heat treatment increases. The external quantum efficiency EQE decreases abruptly when the temperature exceeds 180° C. From the results of FIG. 7, it is favorable for the temperature Ta to be 180° C. or less. It is favorable for the temperature Ta to be, for example, 170° C. or less. It is more favorable for the temperature Ta to be, for example, 160° C. or less.

As shown in FIG. 5, the first value d1 increases as the temperature Ta increases. The first value d1 is 19 nm or less when the temperature Ta is 180° C. or less. It is considered that the external quantum efficiency EQE decreases when the first value d1 is excessively large.

The first value d1 being large corresponds to the size of the region (the crystalline region) of the first compound 31 being large. When the region of the first compound 31 is large, it is considered that the probability of the excitons generated by the irradiated light (and the radiation 81) becoming inert before reaching the interface between the first compound 31 and the second compound 32 is high. For example, it is considered that the probability of recombination occurring between the positive charge and the negative charge is high. For example, the external quantum efficiency EQE decreases due to the recombination.

Accordingly, it is favorable for the first value d1 not to be excessively large. In the embodiment, it is favorable for the first value d1 to be 19 μm or less. This value corresponds to the value when the temperature Ta of the heat treatment is 180° C. It is more favorable for the first value d1 to be 17 μm or less. This value corresponds to the value when the temperature Ta of the heat treatment is about 160° C.

For example, for the photoelectric conversion layer of a solar cell or the like (having a thickness of 500 nm or less), it is known that the efficiency increases as the temperature Ta increases in the range of the temperature Ta of the heat treatment of 160° C. or less. Conversely, in the second experiment (the thickness of the organic layer 30 being about 25 μm) as shown in FIG. 7, the external quantum efficiency EQE decreases when the temperature Ta of the heat treatment is high. Thus, it was found that reverse behaviors are obtained between when the thickness of the organic layer 30 is thin and thick.

In the embodiment, the external quantum efficiency EQE decreases when the temperature Ta of the heat treatment is high. Accordingly, in the embodiment, it is favorable for the first value d1 to be 19 nm or less. It is more favorable for the first value d1 to be 17.5 nm or less. It is more favorable for the first value d1 to be 16.5 nm or less. Thereby, a high external quantum efficiency EQE is obtained. For example, for radiation detection, a high efficiency is obtained; and high sensitivity is obtained.

For example, the relationship between the temperature Ta and the first value d1 (the size of the crystal region) is indistinct for the photoelectric conversion layer (having a thickness of 500 nm or less) of the solar cell, etc.

In the embodiment, there is a tendency for dark current to increase when the temperature Ta of the heat treatment is excessively low (e.g., less than 60° C.). Therefore, it is favorable for the temperature Ta to be 60° C. or more (e.g., 80° C. or more).

As described above, in the embodiment, the first value d1 is about 13 nm or more. It is more favorable for the first value d1 to be not less than 13 nm and not more than 19.0 nm.

In the embodiment, the first value d1 is about 13 nm and is relatively large. Thereby, for example, it is considered that a micro phase separation structure is formed easily in the thickness direction of the organic layer 30 having the first thickness t1 of 1 μm. For example, the positive charge and the negative charge at the phase interface easily reach the first conductive layer 10 or the second conductive layer 20.

On the other hand, the second value d2 is 45.1 nm when the temperature Ta is 180° C. Therefore, in the embodiment, it is favorable for the second value d2 to be 45.1 nm or less. The second value d2 is 45.0 nm when the temperature Ta is 170° C. In the embodiment, it is more favorable for the second value d2 to be 45.0 nm or less. Thereby, for example, it is considered that the phase interface is formed effectively. The positive charge and the negative charge are separated easily. Thereby, a high conversion efficiency is obtained. Thereby, high sensitivity is obtained.

Several examples of the components included in the radiation detector 110 according to the embodiment will now be described.

For example, one of the first conductive layer 10 or the second conductive layer 20 collects the holes generated in the organic layer 30. The other of the first conductive layer 10 or the second conductive layer 20 collects the electrons generated in the organic layer 30. In the example shown in FIG. 1, the radiation 81 passes through the second conductive layer 20 and is incident on the organic layer 30. In the embodiment, the radiation 81 may be incident on the organic layer 30 by passing through the first conductive layer 10.

The organic layer 30 includes, for example, a p-type semiconductor (an electron donor) and an n-type semiconductor (an electron acceptor). The p-type semiconductor includes, for example, the first compound 31. The n-type semiconductor includes, for example, the second compound 32.

The first compound 31 includes, for example, at least one of polythiophene or a derivative of polythiophene. These compounds are, for example, conductive polymers having π-conjugated structures.

For example, polythiophene and derivatives of polythiophene have excellent stereoregularity. The solubility in a solvent is relatively high for these materials. Polythiophene and derivatives of polythiophene have a thiophene skeleton.

The first compound 31 includes, for example, at least one selected from the group consisting of polyarylthiophene, polyalkyl isothionaphthene, and polyethylene dioxythiophene.

The polyarylthiophene recited above includes, for example, at least one of a polyalkylthiophene such as poly(3-methylthiophene), poly(3-butylthiophene), poly(3-hexylthiophene), poly(3-octylthiophene), poly(3-decylthiophene), poly(3-dodecylthiophene), or the like, poly(3-phenylthiophene), or poly(3-(p-alkylphenylthiophene)).

The polyalkyl isothionaphthene recited above includes, for example, at least one selected from the group consisting of poly(3-butyl isothionaphthene), poly(3-hexyl isothionaphthene), poly(3-octyl isothionaphthene), and poly(3-decyl isothionaphthene).

The first compound 31 includes, for example, a polythiophene derivative. The polythiophene derivative includes, for example, at least one selected from the group consisting of carbazole, benzothiadiazole, and a copolymer of thiophene. The copolymer of thiophene includes, for example, poly[N-9"-hepta-decanyl-2,7-carbazole-alt-5,5-(4',7'-di-2-thienyl-2',1',3'-benzothiadiazole)] (PCDTBT).

For example, a high conversion efficiency is obtained by the first compound 31 including polythiophene and a derivative of polythiophene.

The second compound 32 includes, for example, fullerene and a fullerene derivative. The fullerene derivative has a fullerene skeleton. The fullerene and the fullerene derivative include, for example, at least one selected from the group consisting of $C_{60}$, $C_{70}$, $C_{76}$, $C_{78}$, and $C_{84}$. The fullerene derivative includes fullerene oxide. In fullerene oxide, at least a portion of these carbon atoms of fullerene is oxidized. In the fullerene derivative, the carbon atoms of a portion of the fullerene skeleton are modified by any functional group. The fullerene derivative may include a ring formed by these functional groups bonding to each other. The fullerene derivative may include a fullerene-binding polymer. It is favorable for the second compound 32 to include a fullerene derivative including a functional group having high affinity in the solvent. The solubility in a solvent of the compound is high.

The functional group that is included in the fullerene derivative may include, for example, at least one selected from the group consisting of a hydrogen atom, a hydroxide group, a halogen atom, an alkyl group, an alkenyl group, a cyano group, an aromatic hydrocarbon group, and an aromatic heterocyclic group. The halogen atom includes, for example, at least one selected from the group consisting of a fluorine atom and a chlorine atom. The alkyl group includes, for example, at least one selected from the group consisting of a methyl group and an ethyl group. The alkenyl group includes, for example, a vinyl group. The alkoxy group includes, for example, at least one selected from the group consisting of a methoxy group and an ethoxy group. The aromatic hydrocarbon group includes, for example, at least one selected from the group consisting of a phenyl group and a naphthyl group. The aromatic heterocyclic group includes, for example, at least one selected from the group consisting of a thienyl group and a pyridyl group.

The fullerene derivative may include, for example, hydrogenated fullerene. The hydrogenated fullerene includes, for example, $C_{60}H_{36}$ and $C_{70}H_{36}$. The fullerene derivative includes, for example, fullerene oxide. $C_{60}$ or $C_{70}$ of the fullerene oxide is oxidized. The fullerene derivative may include, for example, a fullerene metal complex.

The fullerene derivative may include, for example, at least one selected from the group consisting of [6,6]-phenyl-$C_{61}$-butyric acid methyl ester (60PCBM), [6,6]-phenyl-$C_{71}$-butyric acid methyl ester (70PCBM), indene-$C_{60}$-bis-adduct (60ICBA), dihydronaphthyl-$C_{60}$-bis-adduct (60NCBA), and dihydronaphthyl-$C_{70}$-bis-adduct (70NCBA). 60PCBM is unmodified fullerene. The mobility of the photo carriers is high for 60PCBM.

For example, the organic layer 30 (the organic semiconductor layer) has a bulk heterojunction structure. The bulk heterojunction structure includes, for example, a mixture of a p-type semiconductor material and an n-type semiconductor material. In the bulk heterojunction structure, the phase interface between the p-type semiconductor and the n-type semiconductor can be enlarged. The bulk heterojunction organic semiconductor layer has a micro phase separation structure of a p-type semiconductor material and an n-type semiconductor material. The phase of the p-type semiconductor and the phase of the n-type semiconductor are separated from each other inside the organic semiconductor layer. The organic semiconductor layer includes, for example, a p-n junction.

The radiation 81 is irradiated on the organic layer 30 (the organic semiconductor layer). The radiation 81 is absorbed in the organic layer 30. The positive charge (the holes) and the negative charge (the electrons) are separated at the phase interface recited above. These charges are transported to the first conductive layer 10 or the second conductive layer 20.

For example, the organic layer 30 is formed by coating a solution including the first compound 31, the second compound 32, and a solvent. For example, printing or the like is used. For example, a large surface area radiation detection device can be manufactured inexpensively by using inexpensive apparatuses. The organic layer 30 may be formed by a method including, for example, at least one selected from the group consisting of spin coating, dip coating, casting, bar coating, roll coating, wire-bar coating, spraying, screen printing, gravure printing, flexographic printing, offset printing, gravure-offset printing, dispenser coating, nozzle coating, capillary coating, and inkjet. A method may be used in which these coating methods are combined.

The solvent may include, for example, at least one selected from the group consisting of an unsaturated hydrocarbon solvent, a halogenated aromatic hydrocarbon solvent, a halogenated saturated hydrocarbon solvent, and an ether. The unsaturated hydrocarbon solvent includes, for example, at least one selected from the group consisting of toluene, xylene, tetralin, decalin, mesitylene, n-butylbenzene, sec-butylbenzene, and tert-butylbenzene. The halogenated aromatic hydrocarbon solvent includes, for example, at least one selected from the group consisting of chlorobenzene, dichlorobenzene, and trichlorobenzene. The halogenated saturated hydrocarbon solvent includes at least one selected from the group consisting of carbon tetrachloride, chloroform, dichloromethane, dichloroethane, chlorobutane, bromobutane, chloropentane, chlorohexane, bromohexane, and chlorocyclohexane. The ether includes, for example, at least one selected from the group consisting of tetrahydrofuran and tetrahydropyran.

The halogenated aromatic hydrocarbon solvent may be used solitarily or mixed.

In the solution, it is favorable for the ratio (Cn/Cp) of the concentration (Cp (wt %)) the first compound 31 to the concentration (Cn (wt %)) of the second compound 32 to be not less than 0.05 and not more than 20. The ratio (Cn/Cp) may be, for example, not less than 0.2 and not more than 5.

For example, it is favorable for the ratio of a first weight concentration of the first compound 31 in the organic layer 30 to the second weight concentration of the second compound 32 in the organic layer 30 to be not less than 0.05 and not more than 20. The ratio (Cn/Cp) may be, for example, not less than 0.2 and not more than 5.

The second conductive layer 20 includes, for example, a conductive metal oxide. The conductive metal oxide may include, for example, at least one selected from the group consisting of indium oxide, zinc oxide, tin oxide, indium tin oxide (ITO), tin oxide (FTO) including fluorine, indium-zinc oxide (IZO), and indium-gallium-zinc oxide (IGZO). The second conductive layer 20 includes, for example, a metal film. The metal film includes, for example, at least one selected from the group consisting of lithium, sodium, potassium, calcium, magnesium, barium, strontium, zirconium, titanium, molybdenum, tungsten, manganese, cobalt, nickel, indium, aluminum, tin, gold, platinum, silver, and copper. The second conductive layer 20 may include an alloy including the metals recited above. The second conductive layer 20 may include an oxide of the metals recited above. The second conductive layer 20 may include an organic conductive polymer. The second conductive layer 20 may include, for example, at least one selected from the group consisting of polyaniline, a derivative of polyaniline, polythiophene, and a derivative of polythiophene. The number of films included in the second conductive layer 20 may be one, two, or more. The second conductive layer 20 may include multiple films (a stacked film) having mutually-different work functions.

For example, the second conductive layer 20 may be formed by a method including at least one selected from the group consisting of vacuum vapor deposition, sputtering, ion plating, plating, and coating.

The thickness (the length along the Z-axis direction) of the second conductive layer 20 is, for example, not less than 5 nm and not more than 1 μm. Favorably, the thickness is not less than 15 nm and not more than 300 nm. In the case where the thickness of the second conductive layer 20 is excessively thin, for example, the sheet resistance becomes high. In the case where the thickness of the second conductive layer 20 is excessively thick, the transmittance of the radiation 81 decreases. In the case where the thickness of the second conductive layer 20 is excessively thick, the flexibility is low; and cracks due to stress, etc., occur easily.

The first conductive layer 10 includes, for example, at least one selected from the group consisting of platinum, gold, silver, copper, iron, tin, zinc, aluminum, indium, chrome, lithium, sodium, potassium, cesium, calcium, and magnesium. The first conductive layer 10 may include an alloy including these elements (metals). The first conductive layer 10 may include, for example, an inorganic salt. The inorganic salt includes, for example, at least one selected from the group consisting of lithium fluoride and cesium fluoride. The first conductive layer 10 may include a metal oxide. The metal oxide includes, for example, at least one selected from the group consisting of indium oxide, zinc oxide, tin oxide, indium tin oxide (ITO), tin oxide (FTO) including fluorine, indium-zinc oxide (IZO), indium-gallium-zinc oxide (IGZO), nickel oxide, aluminum oxide, lithium oxide, and cesium oxide.

The number of films included in the first conductive layer 10 may be one, two, or more. The first conductive layer 10 may include multiple films (a stacked film) having mutually-different work functions.

For example, the first conductive layer 10 may be formed by a method including at least one selected from the group consisting of vacuum vapor deposition, sputtering, ion plating, plating, and coating. The thickness (the length along the Z-axis direction) of the first conductive layer 10 is, for example, not less than 1 nm and not more than 1 μm. It is more favorable for the thickness to be not less than 1 nm and not more than 500 nm. It is more favorable for the thickness to be not less than 10 nm and not more than 300 nm. In the case where the first conductive layer 10 is excessively thin, the sheet resistance becomes high. In the case where the first conductive layer 10 is excessively thick, in the formation of the first conductive layer 10, there are cases where heat is applied to the organic layer 30 and the characteristics degrade. The sheet resistance of the first conductive layer 10 is, for example, 500Ω/square or less. It is favorable for the sheet resistance to be, for example, 200Ω/square or less.

The substrate 50 includes, for example, an inorganic material or an organic material. The inorganic material includes, for example, at least one selected from the group consisting of quartz, glass, sapphire, and titania. The organic material includes, for example, at least one selected from the group consisting of polyethylene terephthalate, polyethylene naphthalate, polyethersulfone, polyimide, nylon, polystyrene, polyvinyl alcohol, vinyl chloride, polyethylene, polyvinylidene chloride, aramid, polyphenylene sulfide, polyurethane, polycarbonate, and an epoxy resin.

For example, the substrate 50 has a plate configuration, a film configuration, or a sheet configuration. The thickness (the length along the Z-axis direction) of the substrate 50 is, for example, not less than 5 μm and not more than 20 mm.

In the description recited above, the materials, the thicknesses, etc., are examples; and the embodiment is not limited to the description recited above.

Figure 8:
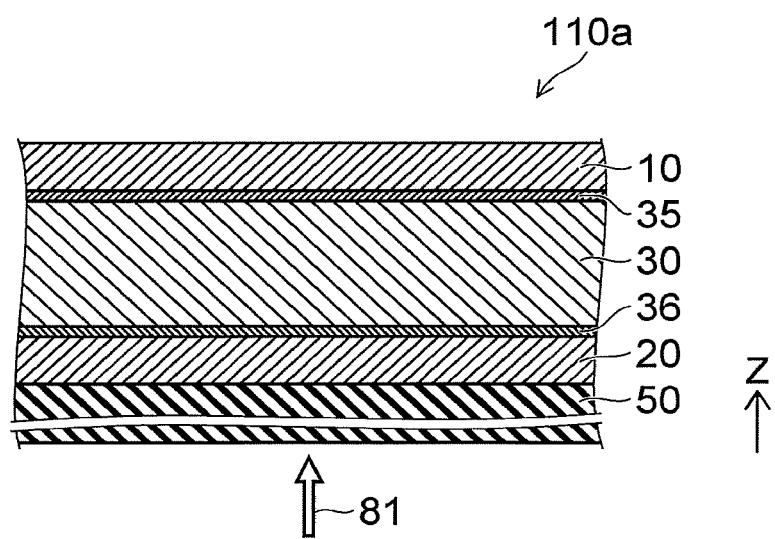
FIG. 8 is a schematic cross-sectional view illustrating another radiation detector according to the first embodiment.

FIG. 8 is a schematic cross-sectional view illustrating another radiation detector according to the first embodiment.

In the radiation detector 110a according to the embodiment as shown in FIG. 8, a first intermediate layer 35 and a second intermediate layer 36 are provided in addition to the first conductive layer 10, the second conductive layer 20, and the organic layer 30. Otherwise, the configuration of the radiation detector 110a is similar to, for example, the configuration of the radiation detector 110. The detection circuit 70, the first interconnect 71, and the second interconnect 72 (referring to FIG. 1) may be provided in the radiation detector 110a.

The first intermediate layer 35 is provided between the organic layer 30 and the first conductive layer 10. The second intermediate layer 36 is provided between the organic layer 30 and the second conductive layer 20.

For example, the first intermediate layer 35 may function as at least one of an electron transport layer or a hole blocking layer. For example, the second intermediate layer 36 may function as at least one of a hole transport layer or an electron blocking layer.

The first intermediate layer 35 may function as at least one of a hole transport layer or an electron blocking layer; and the second intermediate layer 36 may function as at least one of an electron transport layer or a hole blocking layer.

The thickness (the length along the Z-axis direction) of the first intermediate layer 35 is, for example, not less than 5 nm and not more than 100 nm. The thickness (the length along the Z-axis direction) of the second intermediate layer 36 is, for example, not less than 5 nm and not more than 100 nm.

At least one of the first intermediate layer 35 or the second intermediate layer 36 may be provided in the embodiment.

For example, the electron transport layer has the function of efficiently transporting the electrons. The electron transport layer includes, for example, at least one selected from the group consisting of a halogen compound, a metal oxide, and an n-type organic semiconductor. The halogen compound includes, for example, at least one selected from the group consisting of LiF, LiCl, LiBr, LiI, NaF, NaCl, NaBr, NaI, KF, KCl, KBr, KI, and CsF. The metal oxide recited above includes, for example, at least one selected from the group consisting of titanium oxide, molybdenum oxide, vanadium oxide, zinc oxide, calcium oxide, cesium oxide, aluminum oxide, and niobium oxide. A mixture of these substances may be used. The electron transport layer may include, for example, an inorganic material (e.g., metal calcium, etc.).

The n-type organic semiconductor includes, for example, at least one selected from the group consisting of fullerene and a derivative of fullerene. The n-type organic semiconductor includes, for example, a skeleton including at least one selected from the group consisting of $C_{60}$, $C_{70}$, $C_{76}$, $C_{78}$, and $C_{84}$. In the fullerene derivative, for example, the carbon atoms of the fullerene skeleton may be modified by any functional group. The fullerene derivative may include, for example, a ring in which multiple functional groups are bonded to each other. The fullerene derivative includes, for example, a fullerene-binding polymer. The fullerene derivative may include, for example, a functional group having high affinity in a solvent.

The functional group of the fullerene derivative includes, for example, at least one selected from the group consisting of a hydrogen atom, a hydroxide group, a halogen atom, an alkyl group, an alkenyl group, a cyano group, an alkoxy group, an aromatic hydrocarbon group, and an aromatic heterocyclic group. The halogen atom recited above includes, for example, at least one selected from the group consisting of a fluorine atom and a chlorine atom. The alkyl group recited above includes, for example, at least one selected from the group consisting of a methyl group and an ethyl group. The alkenyl group recited above includes, for example, a vinyl group, etc. The alkoxy group recited above includes, for example, at least one selected from the group consisting of a methoxy group and an ethoxy group. The aromatic hydrocarbon group recited above includes, for example, at least one selected from the group consisting of a phenyl group and a naphthyl group. The aromatic heterocyclic group recited above includes, for example, at least one selected from the group consisting of a thienyl group and a pyridyl group.

The fullerene derivative recited above includes, for example, at least one selected from the group consisting of hydrogenated fullerene, oxide fullerene, and a fullerene metal complex. The hydrogenated fullerene includes, for example, at least one selected from the group consisting of $C_{60}H_{36}$ and $C_{70}H_{36}$. The fullerene derivative may include, for example, at least one selected from the group consisting of [6,6]-phenyl-$C_{61}$-butyric acid methyl ester (60PCBM) and [6,6]-phenyl-$C_{71}$-butyric acid methyl ester (70PCBM).

The n-type organic semiconductor may be, for example, a low molecular-weight compound. The film formation of the low molecular-weight compound is possible using vapor deposition. In the low molecular-weight compound recited above, a number-average molecular weight Mn substantially matches a weight-average molecular weight Mw. In the low molecular-weight compound, at least one of the number-average molecular weight Mn or the weight-average molecular weight Mw is 10000 or less. The n-type organic semiconductor may include, for example, at least one selected from the group consisting of BCP (bathocuproine), Bphen (4,7-diphenyl-1,10-phenanthroline), TpPyPB (1,3,5-tri(p-pyrid-3-yl-phenyl)benzene), and DPPS (diphenyl bis (4-pyridiion-3-yl)phenyl)silane).

The thickness of the electron transport layer is, for example, 100 nm or less. For example, the resistance of the electron transport layer is low. For example, a high conversion efficiency is obtained. The thickness of the electron transport layer is, for example, 5 nm or more. In the case where the thickness of the electron transport layer is 5 nm or more, for example, a sufficient hole blocking effect can be obtained. For example, the deactivation of the generated excitons before emitting the electrons and the holes can be suppressed. For example, the current can be extracted efficiently.

For example, the hole transport layer has the function of efficiently transporting the holes. The hole transport layer includes, for example, at least one selected from the group consisting of a p-type organic semiconductor material and a metal oxide. The p-type organic semiconductor recited above includes, for example, a copolymer including a donor unit and an acceptor unit. The donor unit includes, for example, at least one selected from the group consisting of fluorene and thiophene. The acceptor unit includes, for example, benzothiadiazole, etc.

The p-type organic semiconductor recited above includes, for example, at least one selected from the group consisting of polythiophene, a derivative of polythiophene, polypyrrole, a derivative of polypyrrole, a pyrazoline derivative, an arylamine derivative, a stilbene derivative, a triphenyldiamine derivative, oligothiophene, a derivative of oligothiophene, polyvinyl carbazole, a derivative of polyvinyl carbazole, polysilane, a derivative of polysilane, a polysiloxane derivative, polyaniline, a derivative of polyaniline, a phthalocyanine derivative, porphyrin, a derivative of porphyrin, polyphenylene vinylene, a derivative of polyphenylene vinylene, polythienylene vinylene, a derivative of polythienylene vinylene, a benzodithiophene derivative, and a thieno[3,2-b]thiophene derivative. The side chain of the polysiloxane derivative recited above includes, for example, aromatic amine. The main chain of the polysiloxane derivative recited above includes, for example, aromatic amine.

The hole transport layer may include multiple materials selected from those recited above. The hole transport layer may include a copolymer including multiple materials recited above. Polythiophene and derivatives of polythiophene have excellent stereoregularity and have relatively high solubility in a solvent.

The hole transport layer may include, for example, poly [N-9'-heptadecanyl-2,7-carbazole-alt-5,5-(4',7'-di-2-thienyl-2',1',3'-benzothiadiazole)] (PCDTBT). This material is a copolymer including carbazole, benzothiadiazole, and thiophene.

The hole transport layer may include, for example, a copolymer including a benzodithiophene (a BDT) derivative and a thieno[3,2-b]thiophene derivative. The hole transport layer may include, for example, poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7). The hole transport layer may include, for example, PTB7-Th (also called PCE10 or PBDTTT-EFT). A thienyl group that has a weaker electron-donating property than that of the alkoxy group of PTB7 is introduced to PTB7-Th.

The hole transport layer may include, for example, a metal oxide. The metal oxide includes, for example, at least one selected from the group consisting of molybdenum oxide, vanadium oxide, nickel oxide, lithium oxide, calcium oxide, cesium oxide, magnesium oxide, and aluminum oxide. The metal oxide may include a mixture including multiple materials recited above. These materials are inexpensive. The hole transport layer may include, for example, thiocyanate (e.g., copper thiocyanate, etc.).

The hole transport layer may include, for example, a conductive polymer (e.g., polyethylene dioxythiophene, etc.). The hole transport layer may include, for example, a polythiophene polymer (PEDOT or the like) and another material. For example, the appropriate work function as the hole transport layer is obtained.

For example, at least one of the electron transport layer or the hole transport layer is formed by vacuum vapor deposition, sputtering, ion plating, a sol-gel method, coating, plating, etc.

As described above, the radiation 81 is irradiated on the organic layer 30; and a movable charge is generated at the interface (the phase interface) between the first compound 31 (the p-type semiconductor region) and the second compound 32 (the n-type semiconductor region). For example, electrons and holes are generated. The detection circuit 70 (referring to FIG. 1) extracts the charge by applying a bias voltage between the first conductive layer 10 and the second conductive layer 20. For example, the charge is detected in the detection circuit 70.

Figure 9:
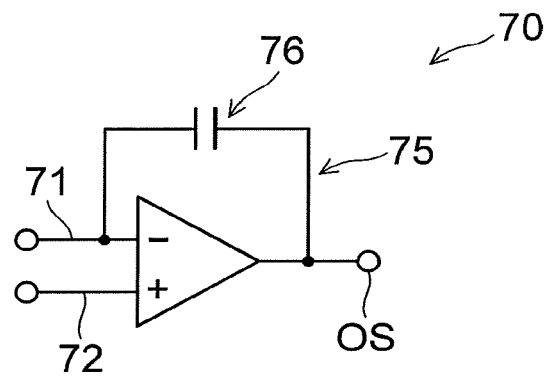
FIG. 9 is a circuit diagram illustrating a portion of the radiation detector according to the first embodiment.

FIG. 9 is a circuit diagram illustrating a portion of the radiation detector according to the first embodiment.

FIG. 9 illustrates a charge amplifier 75 provided in the detection circuit 70. The first interconnect 71 (i.e., the first conductive layer 10) is electrically connected to one of two input terminals of the charge amplifier 75. The second interconnect 72 (i.e., the second conductive layer 20) is electrically connected to the other of the two input terminals of the charge amplifier 75. A capacitance 76 is connected between the negative input of the charge amplifier 75 and the output terminal of the charge amplifier 75. For example, the voltage that corresponds to the charge generated between the first conductive layer 10 and the second conductive layer 20 is obtained as the output signal OS.

A resistor may be provided in parallel with the capacitance 76 in the charge amplifier 75. The input terminal of a reference voltage may be further provided.

Figure 10:
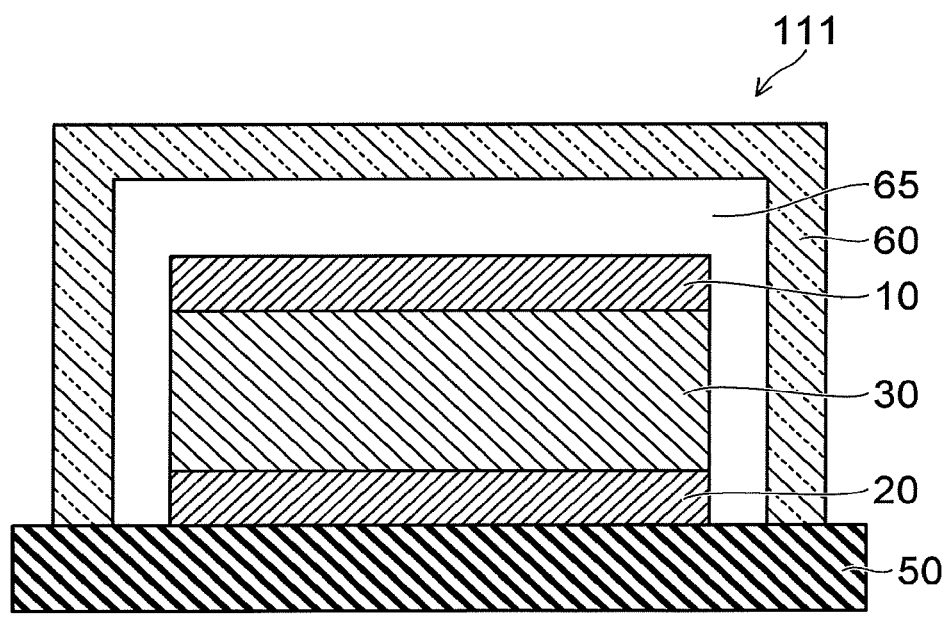
FIG. 10 is a schematic cross-sectional view illustrating another radiation detector according to the first embodiment.

FIG. 10 is a schematic cross-sectional view illustrating another radiation detector according to the first embodiment.

In the radiation detector 111 according to the embodiment as shown in FIG. 10, a sealing member 60 is further provided in addition to the first conductive layer 10, the second conductive layer 20, the organic layer 30, and the substrate 50. The substrate 50 and the sealing member 60 include, for example, glass. The outer edge of the sealing member 60 is bonded to the outer edge of the substrate 50. The first conductive layer 10, the second conductive layer 20, and the organic layer 30 are provided in the space surrounded with the substrate 50 and the sealing member 60. The first conductive layer 10, the second conductive layer 20, and the organic layer 30 are sealed airtightly by the substrate 50 and the sealing member 60. Thereby, stable characteristics are obtained easily. High reliability is obtained.

A space 65 is provided between the sealing member 60 and each of the first conductive layer 10, the second conductive layer 20, and the organic layer 30. For example, an inert gas (e.g., nitrogen gas or the like) is sealed in the space 65.

Figure 11:
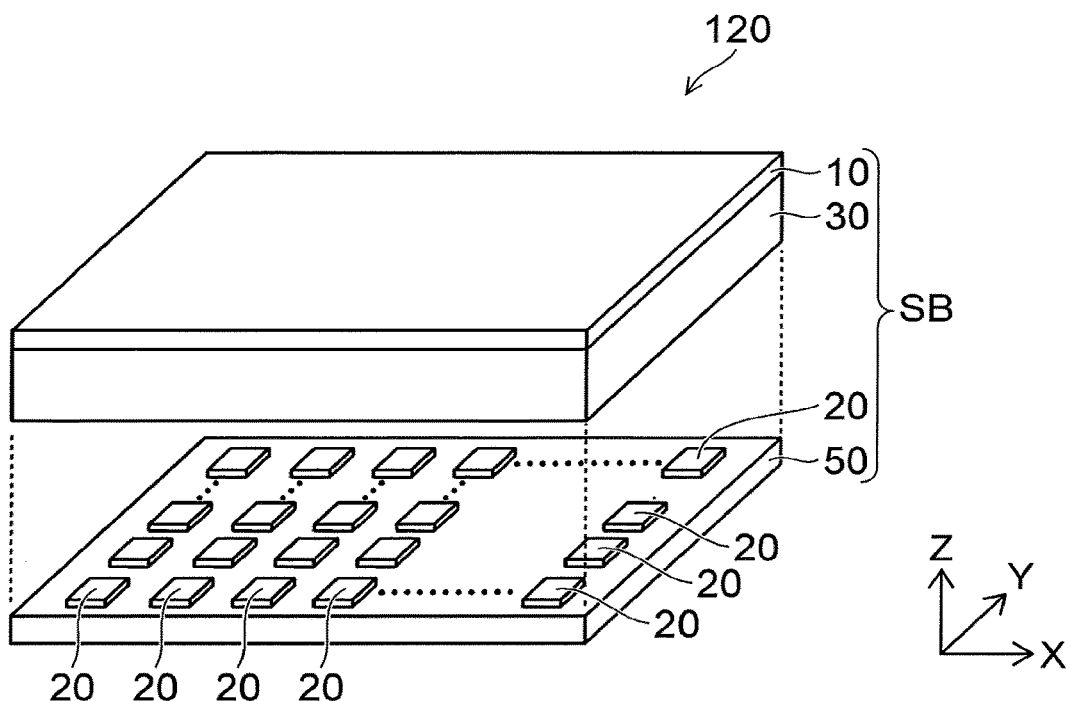
FIG. 11 is a schematic cross-sectional view illustrating a radiation detector according to the first embodiment.

FIG. 11 is a schematic cross-sectional view illustrating a radiation detector according to the first embodiment.

The first conductive layer 10, the second conductive layer 20, and the organic layer 30 are provided in the radiation detector 120 as shown in FIG. 11. The substrate 50 may be further provided. In FIG. 11, some of the components included in the radiation detector 120 are drawn as being separated from each other for easier viewing of the drawing.

Multiple second conductive layers 20 are provided in the radiation detector 120. The multiple second conductive layers 20 are arranged along a plane (e.g., the X-Y plane) crossing the first direction (the Z-axis direction) from the organic layer 30 toward the first conductive layer 10. The X-Y plane is perpendicular to the Z-axis direction.

For example, the multiple second conductive layers 20 are arranged along the X-axis direction and the Y-axis direction. For example, the multiple second conductive layers 20 are arranged in a matrix configuration.

An image that corresponds to the radiation 81 is obtained in the radiation detector 120. The configurations and the modifications of the configurations described in reference to the first embodiment are applicable to the radiation detector 120. In the radiation detector 120 as well, a radiation detector can be provided in which the sensitivity can be increased.

Second Embodiment

A second embodiment relates to a method for manufacturing a radiation detector.

Figure 12:
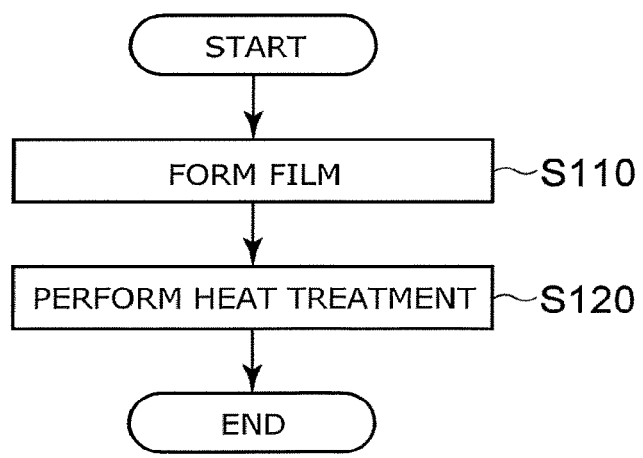
FIG. 12 is a flowchart illustrating a method for manufacturing the radiation detector according to the second embodiment.

FIG. 12 is a flowchart illustrating the method for manufacturing the radiation detector according to the second embodiment.

A film is formed as shown in FIG. 12 (step S110). The film includes a solution including the first compound 31 of the first conductivity type, the second compound 32 of the second conductivity type, and a solvent. For example, the film is formed above the second conductive layer 20. Other layers (e.g., a hole transport layer, etc.) may be provided on the second conductive layer 20.

Heat treatment of the film recited above is performed at the temperature Ta of not less than 60° C. and not more than 180° C. (step S120). The organic layer 30 is formed from the film recited above. After the heat treatment, the thickness (the first thickness t1) of the organic layer 30 obtained from the film recited above is 1 μm or more.

In the manufacturing method according to the embodiment, the first thickness t1 is 1 μm or more; and the temperature Ta is not less than 60° C. and not more than 180° C. Thereby, for example, a high external quantum efficiency EQE is obtained. The radiation can be detected with high sensitivity. The temperature Ta of the heat treatment may be 160° C. or less. The temperature Ta may be 150° C. or less. The temperature Ta of the heat treatment may be 80° C. or more.

For example, it is favorable for the first thickness t1 to be not less than 10 μm and not more than 1000 μm.

It is favorable for the first value d1 described above to be obtained by the organic layer 30 thus manufactured. For example, in the manufacturing method according to the embodiment, the first Bragg angle θ1 (radians), the first full width at half maximum w1 (radians) of the 2θ1 peak, and the X-ray wavelength λ (nm) are obtained for the first peak p1 of X-ray analysis of the organic layer 30. The first value d1 of $(0.9 \cdot \lambda)/(w1 \cdot \cos \theta1)$ obtained from these values is not less than 13 nm and not more than 19 nm. The 2θ1 recited above is not less than 0.0750 radians and not more than 0.1100 radians. The radiation can be detected with high sensitivity.

In the X-ray analysis of the organic layer 30, the second Bragg angle θ2 (radians), the second full width at half maximum w2 (radians) of the 2θ2 peak, and the X-ray wavelength λ (nm) are obtained for the second peak p2. The second value d2 of $(0.9 \cdot \lambda)/(w2 \cdot \cos \theta2)$ obtained from these values is 45 nm or less. The 2θ2 recited above is not less than 0.3194 radians and not more than 0.3543 radians.

For example, in the embodiment, the heat treatment recited above may be performed in a state in which the film recited above is provided between the first conductive layer 10 and the second conductive layer 20.

There is a photoelectric conversion element that uses an organic semiconductor layer. For example, the photoelectric conversion element is used in a solar cell, a light sensor, a light-emitting element, a photodiode, an optical memory, etc. In such applications, the organic semiconductor layer is thin (e.g., 500 nm or less).

On the other hand, in the embodiment, the thickness (the first thickness t1) of the organic layer 30 in the radiation detector including the organic layer 30 is set to be 1 μm or more and is thick. Thereby, a high trap efficiency of the radiation 81 is obtained. It was found that a large first value d1 that cannot be obtained in the case of a thin organic semiconductor layer is obtained for such a thick organic layer 30. Also, it was found that the efficiency decreases if the first value d1 is excessively large. It is considered that the sensitivity of the radiation detector decreases due to much recombination if the first value d1 is excessively large. It was found that a behavior occurs that is different from that of the case where a thin organic semiconductor layer is used as in a solar cell, etc.

In the embodiments, the first value d1 is set to be 19 μm or less. Thereby, high sensitivity is obtained for radiation detection.

According to the embodiments, a radiation detector and a method for manufacturing the radiation detector can be provided in which the sensitivity can be increased.

In this specification, the state of being electrically connected includes the state in which two conductors are in direct contact. The state of being electrically connected includes the state in which two conductors are connected by another conductor (e.g., an interconnect or the like). The state of being electrically connected includes the state in which a switching element (a transistor or the like) is provided in a path between two conductors, and a state is formable in which a current flows in the path between the two conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, organic layers, first compounds, second compounds, detection circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors, and methods for manufacturing the same practicable by an appropriate design modification by one skilled in the art based on the radiation detectors, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
   a first conductive layer;
   a second conductive layer; and
   an organic layer provided between the first conductive layer and the second conductive layer,
   a first thickness of the organic layer along a first direction from the second conductive layer toward the first conductive layer being 1 μm or more,
   the organic layer including a first compound of a first conductivity type, and a second compound of a second conductivity type,
   a first value of $(0.9 \cdot \lambda)/(w1 \cdot \cos \theta1)$ for a first peak of X-ray analysis of the organic layer being not less than 13 nm and not more than 19 nm, the first value being obtained from a first Bragg angle $\theta1$ (radians), a first full width at half maximum $w1$ (radians) of the 2θ1 peak, and an X-ray wavelength $\lambda$ (nm),
   the 2θ1 being not less than 0.0750 radians and not more than 0.1100 radians.

2. The detector according to claim 1, wherein
   a second value of $(0.9 \cdot \lambda)/(w2 \cdot \cos \theta2)$ for a second peak of the X-ray analysis of the organic layer is 45 nm or less, the second value being obtained from a second Bragg angle $\theta2$ (radians), a second full width at half maximum $w2$ (radians) of the 2θ2 peak, and the X-ray wavelength $\lambda$ (nm),
   the 2θ2 being not less than 0.3194 radians and not more than 0.3543 radians.

3. The detector according to claim 1, wherein the second compound includes at least one selected from the group consisting of $C_{60}H_{36}$, $C_{70}H_{36}$, [6,6]-phenyl-$C_{61}$-butyric acid methyl ester, [6,6]-phenyl-$C_{71}$-butyric acid methyl ester, indene-$C_{60}$-bis-adduct, dihydronaphthyl-$C_{60}$-bis-adduct, and dihydronaphthyl-$C_{70}$-bis-adduct.

4. The detector according to claim 1, wherein the second compound includes [6,6]-phenyl-$C_{71}$-butyric acid methyl ester.

5. The detector according to claim 1, wherein the first compound includes at least one selected from the group consisting of poly(3-methylthiophene), poly(3-butylthiophene), poly(3-hexylthiophene), poly(3-octylthiophene), poly(3-decylthiophene), poly(3-dodecylthiophene), poly(3-phenylthiophene), poly(3-(p-alkylphenylthiophene)), poly(3-butyl isothionaphthene), poly(3-hexyl isothionaphthene), poly(3-octyl isothionaphthene), poly(3-decyl isothionaphthene), and polyethylene dioxythiophene.

6. The detector according to claim 1, wherein the first compound includes poly(3-hexylthiophene).

7. The detector according to claim 1, wherein a ratio of a first weight concentration of the first compound in the organic layer to a second weight concentration of the second compound in the organic layer is not less than 0.1 and not more than 20.

8. The detector according to claim 1, wherein the first thickness is not less than 10 μm and not more than 1000 μm.

9. The detector according to claim 1, further comprising a first intermediate layer provided between the first conductive layer and the organic layer,
   the first intermediate layer functioning as at least one of a hole transport layer or an electron blocking layer.

10. The detector according to claim 1, further comprising a first intermediate layer provided between the first conductive layer and the organic layer,
  the first intermediate layer including at least one of a first material or a second material,
  the first material including at least one selected from the group consisting of polythiophene, a derivative of polythiophene, polypyrrole, a derivative of polypyrrole, a pyrazoline derivative, an arylamine derivative, a stilbene derivative, a triphenyldiamine derivative, oligothiophene, a derivative of oligothiophene, polyvinyl carbazole, a derivative of polyvinyl carbazole, polysilane, a derivative of polysilane, a polysiloxane derivative, polyaniline, a derivative of polyaniline, a phthalocyanine derivative, porphyrin, a derivative of porphyrin, polyphenylene vinylene, a derivative of polyphenylene vinylene, polythienylene vinylene, a derivative of polythienylene vinylene, a benzodithiophene derivative, and a thieno[3,2-b]thiophene derivative,
  the second material including at least one selected from the group consisting of molybdenum oxide, vanadium oxide, nickel oxide, lithium oxide, calcium oxide, cesium oxide, magnesium oxide, and aluminum oxide.

11. The detector according to claim 1, further comprising a second intermediate layer provided between the second conductive layer and the organic layer,
  the second intermediate layer functioning as at least one of an electron transport layer or a hole blocking layer.

12. The detector according to claim 1, further comprising a second intermediate layer provided between the second conductive layer and the organic layer,
  the second intermediate layer including at least one selected from the group consisting of a halogen compound, a metal oxide, and an n-type organic semiconductor,
  the halogen compound including at least one selected from the group consisting of LiF, LiCl, LiBr, LiI, NaF, NaCl, NaBr, NaI, KF, KCl, KBr, KI, and CsF,
  the metal oxide including at least one selected from the group consisting of titanium oxide, molybdenum oxide, vanadium oxide, zinc oxide, calcium oxide, cesium oxide, aluminum oxide, and niobium oxide,
  the n-type organic semiconductor including at least one selected from the group consisting of fullerene and a derivative of fullerene.

* * * * *